(12) United States Patent
Eisenstock et al.

(10) Patent No.: US 8,524,035 B2
(45) Date of Patent: *Sep. 3, 2013

(54) METHOD AND APPARATUS FOR CONFORMABLE POLISHING

(75) Inventors: Gregory Eisenstock, Rochester, NY (US); Anurag Jain, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 579 days.

This patent is subject to a terminal disclaimer.

(21) Appl. No.: 12/627,632

(22) Filed: Nov. 30, 2009

(65) Prior Publication Data

US 2011/0130003 A1 Jun. 2, 2011

(51) Int. Cl.
   *C23F 1/08* (2006.01)
   *B24B 7/06* (2006.01)
   *B24B 1/00* (2006.01)
   *B24B 29/00* (2006.01)

(52) U.S. Cl.
   USPC .... 156/345.12; 451/59; 451/288; 257/E21.23

(58) Field of Classification Search
   USPC ............. 156/345.12, 345.13, 345.14, 345.15; 451/59, 288; 438/692; 257/E21.23
   See application file for complete search history.

(56) References Cited

U.S. PATENT DOCUMENTS

| | | | |
|---|---|---|---|
| 5,605,499 A | 2/1997 | Sugiyama et al. | 451/443 |
| 6,203,414 B1 * | 3/2001 | Numoto et al. | 451/288 |
| 6,953,515 B2 * | 10/2005 | Boyd et al. | 156/345.16 |
| 7,207,871 B1 | 4/2007 | Zuniga et al. | 451/288 |
| 7,223,158 B2 | 5/2007 | Boo et al. | 451/398 |
| 7,357,703 B2 | 4/2008 | Nishimura et al. | 451/527 |
| 7,364,496 B2 * | 4/2008 | Berkstresser et al. | 451/41 |
| 7,445,543 B2 * | 11/2008 | Torii et al. | 451/289 |
| 8,148,266 B2 * | 4/2012 | Eisenstock et al. | 438/692 |
| 2002/0037649 A1 * | 3/2002 | Shingu et al. | 438/692 |
| 2003/0168169 A1 * | 9/2003 | Ishikawa et al. | 156/345.12 |
| 2004/0209559 A1 | 10/2004 | Birang et al. | 451/285 |
| 2008/0299871 A1 | 12/2008 | Eisenstock et al. | 451/23 |
| 2011/0130003 A1 * | 6/2011 | Eisenstock et al. | 438/692 |

FOREIGN PATENT DOCUMENTS

EP 0 845 328 6/1998

* cited by examiner

*Primary Examiner* — Sylvia R MacArthur
(74) *Attorney, Agent, or Firm* — Ryan T. Hardee

(57) ABSTRACT

Methods and apparatus provide for a conformable polishing head for uniformly polishing a workpiece. The polishing head includes an elastic polishing pad mounted on an elastic membrane that seals a cavity in the polishing head. The cavity is pressurized to expand the membrane and press the polishing pad down on the top surface of the workpiece, such that the polishing pad conforms to the surface and applies a substantially uniform pressure distribution across the workpiece and thereby uniformly removes material across high and low spots on the workpiece.

10 Claims, 7 Drawing Sheets

METHOD AND APPARATUS FOR CONFORMABLE POLISHING

BACKGROUND OF THE INVENTION

The present invention relates to methods and apparatus for conformable polishing flat rigid workpieces using chemical mechanical polishing ("CMP"), for example, conformable CMP polishing of semiconductor wafers or tiles, semiconductor on insulator substrates, or semiconductor on glass substrates.

CMP processes and equipment have been employed in polishing substrates such as semiconductor wafers for use as substrates for solid state electronic devices. High electrical performance semiconductor on insulator (SOI) technology, an engineered multilayer semiconductor substrate, has been employed for high performance thin film transistors, CPU's, and may be used for solar cells, and flat panel displays, such as active matrix liquid crystal (AMLCD) and organic light emitting diode (AMOLED) displays. SOI structures or substrates include a thin layer of substantially single crystal semiconductor material on an insulating semiconductor material. For example, an SOI substrate may include a thin single crystal silicon layer on an insulating amorphous or polycrystalline silicon material. A less expensive glass or glass-ceramic material may be used to form the insulating or handle substrate in place of the much more expensive semiconductor material, thereby producing a single crystal silicon (or other single crystal semiconductor material) on glass "SOG" substrate suitable for display, sensors, photovoltaics, solar cells and other applications.

SOG substrates may be considered a subset of SOI substrates. Unless otherwise expressly stated or described, all descriptions of SOI products and processes contained herein are intended to include SOG products and processes as well as other types of SOI products and processes.

One way of obtaining the thin semiconductor layers required for SOI structures is epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation of ions, such as hydrogen, helium or oxygen ions, to either (a) form a buried oxide layer in the silicon wafer topped by Si in the case of oxygen ion implantation, or (b) form a weakened layer in the silicon donor wafer in order to separate (exfoliate) a thin Si layer for film from the donor wafer in the case of hydrogen or helium ion implantation. Such processes have been used to separate a thin layer or film of silicon or other semiconductor material from a donor wafer and transfer the thin film to a handle or insulating substrate to produce an SOI substrate. Such processes are referred to herein as "ion implantation thin film transfer processes" or simply "thin film transfer processes."

Several methods have been employed to separate the thin layer or film from the donor wafer in ion implantation thin film transfer processes and bond the silicon layer to an insulating substrate. U.S. Pat. Nos. 5,374,564 and 6,013,563 disclose thermal bonding and separation thin film transfer processes for producing SW substrates, in which an ion implanted single crystal silicon donor wafer is brought into contact with a surface of an insulating semiconductor substrate or handle wafer. Heat, e.g. thermal energy, is then applied to thermally bond the donor wafer to the handle wafer and separate a thin layer of silicon from the donor wafer, thereby leaving a thin film of single crystal silicon (or other single crystal semiconductor material) thermally bonded to the handle wafer. U.S. Pat. No. 7,176,528 discloses an anodic bonding and separation ion implantation thin film transfer process for producing SOG substrates, in which an ion implanted single crystal silicon donor wafer is brought into contact with a surface of an insulating glass or glass ceramic substrate. Heat and voltage are applied to the wafer and the glass substrate (pressure may also be applied) to anodically bond the wafer to the glass substrate and separate a thin layer of silicon from the wafer, thereby leaving a thin film of single crystal silicon (or other single crystal semiconductor material) anodically bonded to the glass substrate.

After the removal of a first thin layer or film of silicon (or other semiconductor material) from the donor semiconductor wafer in an SOG process, which may remove only a 200 nanometer to 800 nanometer layer of material, about 99% or more of the donor semiconductor wafer remains. Due to the relatively high cost of single crystal silicon and other semiconductor materials, it is desirable to re-use the remaining portion of the donor wafer as many times as possible to reduce material costs. Large area SOI structures may be produced by arraying a plurality of laterally disposed individual rectangular donor wafers (or "tiles") on a single insulating substrate (such as a display grade sheet of glass or glass-ceramic material), separating a plurality of thin rectangular semiconductor layers from the tiles, and bonding the layers to the insulating substrate (a process referred to herein as "tiling"). Use of a plurality of donor wafers or tiles multiplies the economic savings achievable through re-use of the donor wafers.

After separation of a layer from a donor semiconductor wafer in an ion implantation thin film transfer process, the exfoliated or cleaved surface of the donor wafer and of the SOI substrate includes residual ions from the implantation process and crystalline damage from the implantation and separation process. In order to re-use a donor semiconductor wafer, it is necessary to refinish or refresh the exfoliated surface of the donor wafer by curing or removing the exfoliated surface to return it to a relatively damage-free and ion contamination free state. Similarly, in order to provide the resulting SOI substrate with the desired electrical properties, it is necessary to cure the ion contaminated and damaged outer layer of the exfoliated surface of the SOI substrate or remove this outer layer through etching or polishing. This ion contaminated and damaged outer layer of the donor wafer and of the SOI substrate has been removed using conventional chemical CMP techniques. While CMP techniques are well documented and existing equipment may be readily obtained, there are a number of drawbacks with the existing CMP technology in the context of semiconductor re-use in ion implantation thin film transfer processes. A number of these drawbacks are described below.

Chemical, mechanical polishing ("CMP") is one accepted method of planarizing and polishing substrates used in semiconductor device fabrication. FIG. 1 is a schematic illustration of a conventional chemical CMP setup, in which a workpiece 1 is mounted on a carrier or polishing head 3 using a vacuum/suction or surface tension. An exposed surface of the wafer is pressed against a polishing pad 5, which may be a standard pad or a fixed-abrasive pad, mounted on a rigid turn table 7 to create relative motion between the abrasive pad and the wafer. A standard pad has a durable roughened surface, whereas a fixed-abrasive pad has abrasive particles held in a containment media. A polishing slurry, including a chemically-reactive agent (and abrasive particles if a standard pad is used) is applied to the surface of the polishing pad. The carrier head provides a controllable load, i.e., pressure, on the substrate 1 to push it against the polishing pad 5. In order to achieve a more uniform polishing across the surface of the wafer, a mechanism may be provided in the polisher head to apply uniform pressure on the back surface of the wafer and a reciprocating, oscillating or orbital motion may be provided between the polisher head 3 and the turn table. CMP processes provides a high polishing rate and a resulting flat planar substrate surface that is free of significant large scale surface topography (e.g. substantially planar/flat) and small-scale surface roughness (e.g. smooth).

As shown in FIG. 1, conventional CMP processes apply the polishing pressure to the back surface of a relatively rigid workpiece having finite modulus of elasticity (e.g. the semiconductor donor wafer in that case of SOI fabrication processes). This method of pressure application results in a non-uniform pressure distribution across the wafer surface. Line A in FIG. 2 plots the result of finite element analysis of the pressure distribution across a round wafer during polishing in a conventional CMP system. As can be seen in FIG. 2, the polishing pressure is highest in the middle and decreases to zero at the wafer edges. This uneven pressure distribution results in non-uniform material removal across the wafer surface which affects the flatness of the polished wafer. The flatness or planarity requirements of the semiconductor donor wafers used for SOI applications are stringent and are typically in the range of less than 5 μm (5000 nm) variations in amplitude and over 20 mm in pitch, e.g. distance from peak to peak.

As a result of the non-uniform material removal with conventional CMP processes, an excess amount of material must be removed from the exfoliated surface of the donor wafer to adequately refresh the surface of the donor wafer for reuse with convention CMP processes. For example, if 0.150 microns (150 nm) of actual damage and contamination needs to be removed from the exfoliated surface of a donor wafer, then to be certain that the damage and contaminated layer has been completely removed from the whole surface of the donor wafer, taking into account the aforementioned non-uniform characteristics of the CMP protocols, at least 1.0 micron (1000 nm) may need to be removed from the donor wafer. Thus, over six times the thickness of the actual damage may need to be removed in order to ensure that all the damage and contamination is removed, which is highly wasteful and has significant, negative cost implications.

Conventional CMP processes may exhibit particularly poor results when polishing non-round workpieces, such as rectangular semiconductor wafers (or tiles) or SOI substrates having sharp corners, as may be employed when tiling to produce large area SOI substrates. The aforementioned non-uniform material removal is amplified at the corners of rectangular donor wafers due to higher polishing speed and non-uniform polishing pressure at these locations, which result in faster material removal at the corners of the wafer compared with the center of the wafer. This is know as the "pillow" or "pillowing" effect, because the rectangular donor wafer takes on a non-planar pillow-like shape with reduced thickness at the corners compared to the central region of the rectangular donor wafers or tiles. Multiple re-uses of rectangular donor wafers by such CMP protocols multiplies the pillow effect, resulting in the premature end to a given wafer's re-use life cycle as the surface geometry (especially near the corners) diverges from acceptable re-use functional limits as result of the pillowing effect. Thus, the number of times a rectangular wafer can be effectively re-used employing conventional CMP techniques is limited. As such, there is a need for a process of refinishing or refreshing the surface of semiconductor donor wafers, especially rectangular semiconductor donor tiles, that increases the number of times that a donor wafer or donor tile may be reused in an ion implantation thin film transfer SOT fabrication process.

Conventional planarizing CMP processes and equipment are also often unsatisfactory for polishing of substrates with very thin layers thereon, such as SOI substrates. FIG. 3 (not drawn to scale) diagrammatically illustrates an SOG substrate 11 that maybe used, for example, as a backplane substrate for AMLCD or organic light emitting diode AMOLED display panels, sensors, photovoltaics, solar cells, etc.

An SOG substrate includes an insulating substrate of glass or glass ceramic 13. Glass or glass-ceramic substrates typically have relatively large variations in surface topography as compared to a semiconductor wafer in an SOI process and as compared to the thin semiconductor layer on an SOG substrate. For example, as illustrated in FIG. 3, a glass substrate may have large scale or macro surface variations or undulations with high spots 17 and low spots 19 that may have an amplitude of about 20 μm (20000 nm). Whereas the semiconductor layer 15 on the glass substrate 13 is a very thin layer or layers of material that conforms to the macro surface topography of the glass substrate surface. These thin semiconductor layers or films typically have a thickness on the order of several hundreds of nanometers thick, which is thinner by many orders of magnitude than the amplitude of the macro surface topography variations of the underlying glass substrate of 20000 nanometers. For example, a semiconductor layer having an initial thickness of about 420 nm may be transferred from a donor wafer onto the glass substrate in an ion implantation thin film transfer process. This "as transferred" layer must then be thinned to remove the ion contaminated and damaged outer layer and reduce the layers thickness down to the desired final thickness of about 200 nm by removing about 220 nm of material. Thus, the 20000 nm variations in surface topography of the underlying substrate is a hundred times larger than the 200 nm thickness of the final Si layer 7 and the 220 nm layer of material that must be removed in order to obtain the desired final 200 nm layer thickness.

When conventional planarizing CMP polishing techniques are employed to thin an as deposited silicon layer on an SOG substrate 11, the entire as deposited silicon layer 15 is often unacceptably removed from the high spots 17 of the large scale undulations on the insulating glass substrate 13. For example, if an SOG substrate 11 were thinned down to the plane designated by line P in FIG. 3, then the entire silicon layer 15 would be removed from the high spots 17 of the undulations in the surface of the glass, thus creating holes through the silicon layer 15. Yet, the damaged and contaminated top layer of the as transferred silicon layer 15 remains untouched and un-thinned over the low spots 19. In order to avoid removing entire portions of the layer(s) and creating holes in the layer(s), the finishing apparatus should compensate for or conform to the undulating surface of the thin film 15 while removing material therefrom, such that material is substantially uniformly removed across the surface of the film. Commonly owned pending Published U.S. Application 2008/0299871A1 discloses a conformable polishing apparatus.

Accordingly, there is a need for an efficient and effective "conformable" polishing process for uniformly thinning the as transferred thin film on an SOI, and especially an SOG substrate, in an ion implantation thin film transfer process.

SUMMARY

In accordance with one aspect of the present invention, methods and apparatus provide polishing of a relatively thin, rigid, planar workpiece, such as a semiconductor wafer, by mounting the bottom surface of the workpiece on a vacuum chuck on a rigid rotating base and applying polishing pressure on a top surface of the workpiece by means of a rotating polishing head. The polishing head includes a pressurized fluid chamber defined at its outer lower surface by an elastic membrane. An elastic abrasive pad is mounted to the outer, lower surface of the elastic membrane and is pressed against the workpiece to apply a uniform pressure distribution over the surface of the workpiece. The workpiece may be a non-round or a rectangular workpiece. The workpiece may have an undulating surface and a thin layer or film of material on the undulating surface having a thickness that is substantially less than and amplitude or height of the undulations on the surface of the workpiece. The thin layer may be thinned by removing a thickness of material that substantially larger than the height of the undulations, without removing the layer entirely at high spot on the undulations.

According to another aspect of the present invention a conformable polishing apparatus is provided having a base upon which a workpiece may be releasably coupled; a rotary polisher having a resiliently conformable annular polishing pad mounted thereon for contacting and resiliently conforming to a surface of a workpiece coupled to the base; and one of the base and the polisher being mounted for lateral movement relative to the other, such that the annular polishing pad rotates and moves laterally against a surface of a workpiece coupled to the base and uniformly removes material from the entire surface of the workpiece.

The base and the polisher may be mounted for oscillating movement relative to the other, such that the annular polishing pad rotates and laterally oscillates against a surface of a workpiece coupled to the base.

The base includes a conveyor upon which a plurality of workpieces may be releasably coupled for moving the workpieces laterally past the polisher one workpiece at a time in a continuous process.

According to another aspect of the present invention the rotary polisher includes a polishing head, a cavity in the polishing head behind the annular polishing pad, and a pressurized fluid supply channel communicating with the cavity for providing fluid at a controlled pressure to the cavity and pressing the annular polishing pad against a surface of a workpiece coupled to the base with a uniform pressure.

The polishing head may define a downwardly opening cavity with an elastic membrane spanning the downwardly opening cavity and sealingly encloses the downwardly opening cavity to form a pressure cavity, with the annular polishing pad mounted on an outer surface of the elastic membrane. A fluid supply channel in the polishing head may communicate with the pressure cavity for providing fluid at a controlled pressure to the pressure cavity for inflating the elastic membrane and pressing the annular polishing pad against a surface of a workpiece coupled to the base with a uniform pressure.

The rotary polisher may include a spindle; the polishing head is mounted on an end of the spindle; a supply conduit extends axially through a center of the spindle; and there is a hole in a center of the elastic membrane defining an inner peripheral edge on the elastic membrane, wherein the inner peripheral edge of the elastic membrane is sealingly attached to an end of the supply conduit, such that polishing slurry is supplied through the supply conduit to a center of the annular polishing pad.

The supply conduit may be a flexible tube. A rigid disc may be sealingly attached to a lower end of the tube and lie against the outer surface of the elastic membrane, such that the flexible tube may bend and allow the disk to tilt. The annular polishing pad may be attached to an outer surface of the rigid disk.

According to another aspect of the present invention, a conformable polishing apparatus includes: a rotary polishing head; a flexible annular polishing pad on the polishing head for conforming to and applying a uniform polishing pressure to a surface of a workpiece; a supply conduit extending axially through a center of the polishing head and a center of the polishing pad for supplying polishing slurry to a center of the polishing pad.

The polishing apparatus may include: an open cavity in an outer face of the polishing head; an elastic membrane sealingly enclosing the open cavity in the polishing head; the annular polishing pad is located on an outer surface of the elastic membrane; the supply conduit extends axially through a center of the membrane and the center of the polishing pad; and a supply channel in the polishing head communicates with the cavity for providing pressurized fluid at a controlled pressure to the pressure cavity for inflating the elastic membrane and conformably pressing the annular polishing pad against a surface of a workpiece with a uniform polishing pressure.

According to another aspect of the present invention, a conformable polishing apparatus may include: a table upon which a workpiece may be releasably mounted; rotary polishing head having an outer face for polishing the workpiece; a flexible annular polishing pad on the outer face of the polishing head; and a fixture for (a) mounting the rotary polishing head with the polishing pad in contact with a surface of a workpiece mounted on the table, and (b) creating oscillating movement between the table and polishing head, such that the polishing pad rotates and oscillates against a surface of a workpiece mounted on the table, flexibly conforms to the surface of the workpiece, and thereby uniformly removes a substantially uniform thickness of material from the entire surface of the workpiece.

The conformable polishing may include: an inflatable elastic membrane on an outer face of the polishing head, with the flexible annular polishing pad attached to an outer surface of the inflatable elastic membrane; and a means for inflating the elastic membrane to a controlled pressure and pressing the polishing pad against a surface of a workpiece with a uniform polishing pressure.

According to another aspect of the present invention, a method for uniformly removing material from a surface of a workpiece may include: mounting the workpiece to a table; pressing a flexible annular polishing pad against the surface of the workpiece with substantially uniform pressure distribution; rotating the annular polishing pad, while translating the annular polishing pad across the surface of the workpiece, thereby removing a substantially uniform thickness of material from the surface of the workpiece.

The step of translating the annular polishing pad across the surface of the workpiece may include (a) oscillating one of the polishing pad and the table or (b) conveying a plurality of workpieces on the table and past the annular polishing pad one workpiece at a time in continuous process.

The step of pressing the flexible annular polishing pad against the surface of the workpiece may include providing an inflatable elastic membrane behind the annular polishing pad, inflating the elastic membrane, and thereby conformably pressing the annular polishing pad against the surface of the workpiece with a substantially uniform pressure.

The method may supply polishing slurry through a center of the elastic membrane and a center of the polishing pad to the surface of the workpiece.

The method may polish a workpiece with an undulating surface and a layer of material on the undulating surface, the layer of material may have a thickness that is less than a height of undulations on the surface. The layer of material may be substantially thinner than both the height of the undulations and the thickness of material removed by a factor of 10 or more. The workpiece may be a non-round workpiece, such as a flat rectangular workpiece.

Other aspects, features, and advantages of the present invention will be apparent to one skilled in the art from the description herein taken in conjunction with the accompanying drawings.

DESCRIPTION OF THE DRAWINGS

Other aspects, features, and advantages of the present invention will be apparent to one skilled in the art from the description herein in conjunction with the accompanying drawings, wherein like numerals indicate like elements. It being understood, however, that the invention is not intended to be limited to the precise arrangements and instrumentalities shown in the accompanying drawings, of which.

DETAILED DESCRIPTION

Figure 4:
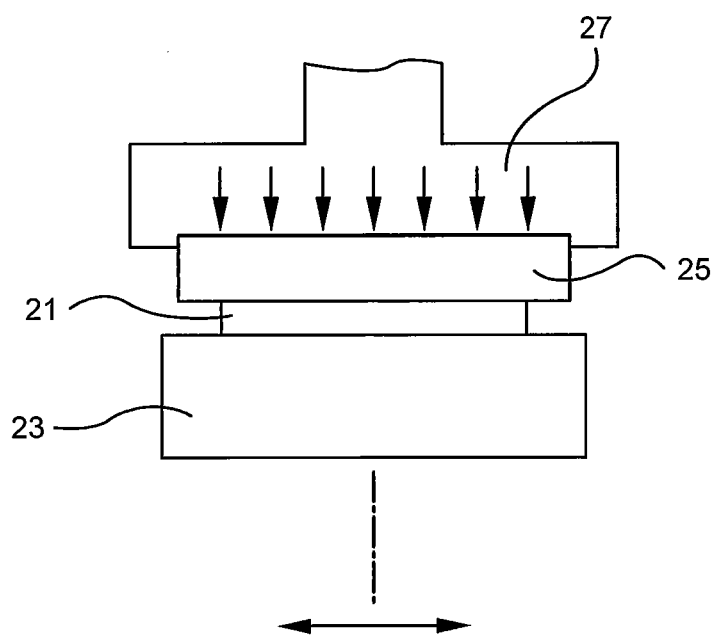
FIG. 4 is a diagrammatic side elevational view of a CMP polishing system according to the present invention.

FIG. 4 is a diagrammatic illustration of a conformable polishing system and method as disclosed herein. A relatively thin, flat, rigid workpiece 21, such as a silicon wafer or an SOI or other engineered substrate, is mounted in a known manner on a vacuum chuck (not shown) provided in or on the top surface of an oscillating base or table 23. A rotating conformable polishing pad 25 is pressed down by a rotary polishing head 27 on the top surface of the workpiece 21. The polishing pad is a flexible or elastic pad having a flexural modulus of elasticity (such as 20-100 MPa) that is significantly lower than the flexural modulus of elasticity of the workpiece, such as a semiconductor wafer (112,000 MPa) or SOI substrate, making the polishing pad 25 more flexible or conformable than the relatively stiff and rigid workpiece 5, 21. The relatively flexible polishing pad 25 conforms to the surface of the workpiece 21 to a greater degree than in conventional CMP processes illustrated in FIG. 1.

Figure 1:
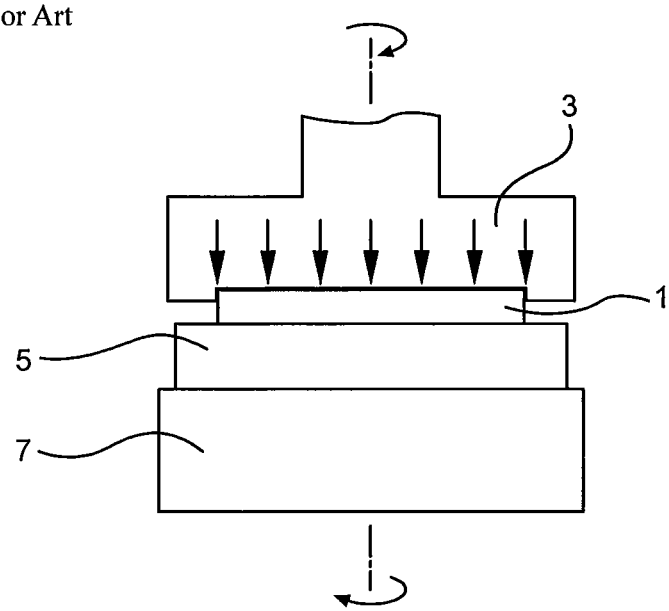
FIG. 1 is a diagrammatic side elevational view of a conventional prior art CMP polishing system.
Figure 2:
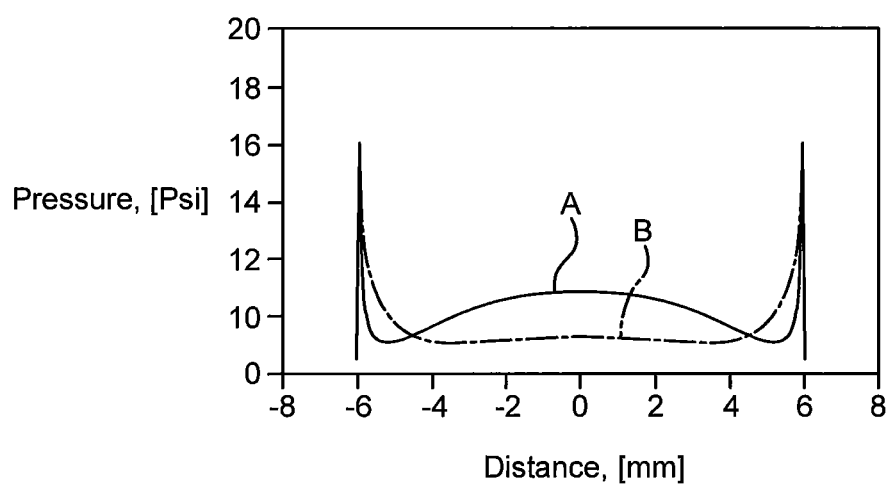
FIG. 2 is a graph illustrating the polishing pressure applied across a surface of a workpiece in a conventional CMP system and in a CMP system according the one embodiment of the present invention as calculated using finite element analysis.

The calculated pressure distribution of a conventional CMP processes is illustrated by line A in FIG. 2, and the calculated pressure distribution of the CMP process described herein is illustrated by line B. In conventional CMP processes, in which the polishing pressure is applied to the back of the workpiece, e.g. the side opposite the side that is to be polished, as illustrated in FIG. 1, the stiffness of the wafer material results in a non-uniform pressure distribution across the workpiece surface, with the highest pressure at the center of the wafer which gradually decreases to zero at the wafer edge line A. In the polishing process described herein (as illustrated in FIG. 4), pressure is applied to the front of the workpiece, e.g. the side that is to be polished, by means of a conformable elastic abrasive pad. The application of pressure through a conformable elastic abrasive pad that has a much lower rigidity compared with the workpiece, such as a silicon wafer or an SOI substrate, results in a more uniform pressure distribution (line B) over the polishing area, than a conventional CMP processes (line A).

Figure 3:
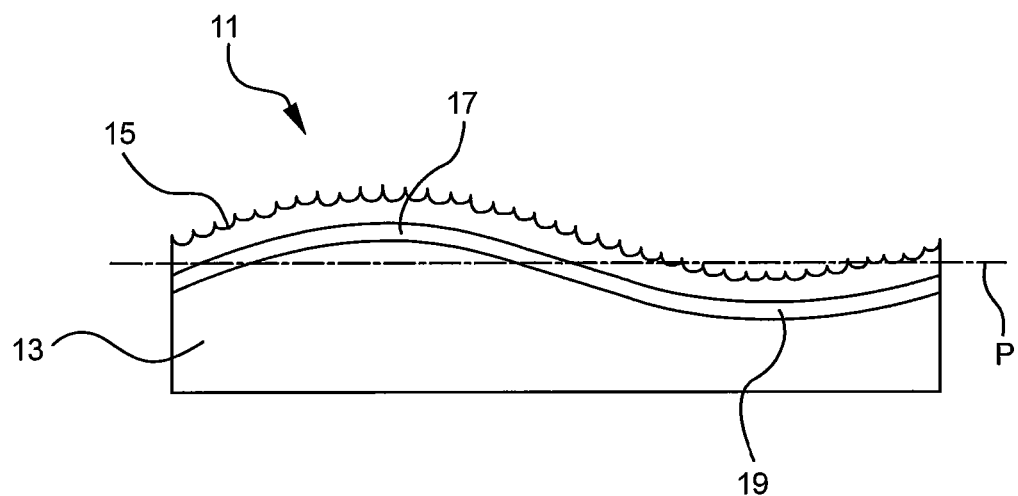
FIG. 3 is a diagrammatic edge view (of the surface of a silicon on glass (SOG) substrate.

The relatively more uniform polishing pressure provided by the conformable polishing process described herein generates more uniform material removal across the workpiece surface, and thereby provides both (1) improved maintenance of film thickness uniformity during polishing and thinning of uneven surfaces compared to conventional CMP processes and (2) a reduction in the pillowing effect when polishing non-round workpieces. As discussed above, uniform material removal across an uneven surface is very important when polishing or thinning flat substrates having an uneven or undulating surface with a very thin layer of material on the uneven surface, such as SOG substrates as illustrated in FIG. 3, in order to avoid creating holes in the thin layer. As discussed above, a reduction in the pillowing effect when polishing rectangular donor wafers or tiles enables a greater number of re-use cycles of rectangular donor wafers or tiles.

Figure 5:
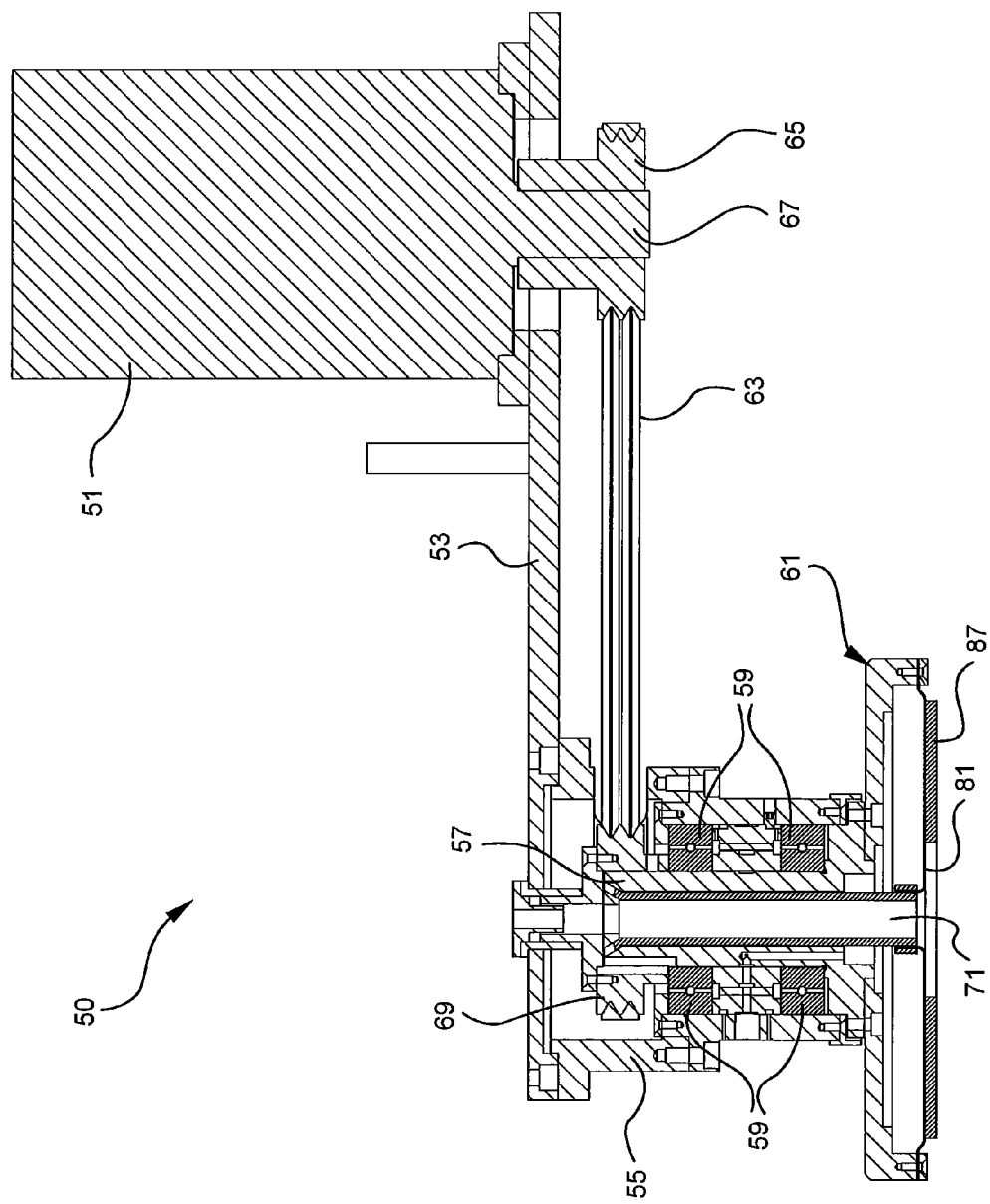
FIG. 5 is an cross-sectional side view of a rotary polishing system in accordance with one embodiment of the present invention.

FIG. 5 illustrates one embodiment of a rotary polisher 50 for practicing a conformable CMP process as described herein. The polisher consists of an electric motor 51, for example, a DC servo motor, attached a mounting plate 53. A polisher housing 55 is also attached to the mounting plate 53. A spindle 57 is rotational mounted in the polisher housing by bearings 59 and a polishing head 61 is mounted to a lower end of the spindle 57. A drive belt 63 is mounted between a motor or drive pulley 65 on an output shaft 67 of the motor and a driven pulley 69 on an upper end of the spindle 57 drivingly connects the motor output shaft 65 to the polisher spindle 57 for rotating the polishing head 61. Drive trains other than a drive belt, such as a geared drive train, may be employed in place of the drive belt to drivingly connect the motor output shaft 67 to the polisher spindle 57. A slurry supply conduit 71 extends through the center of the spindle.

Figure 6:
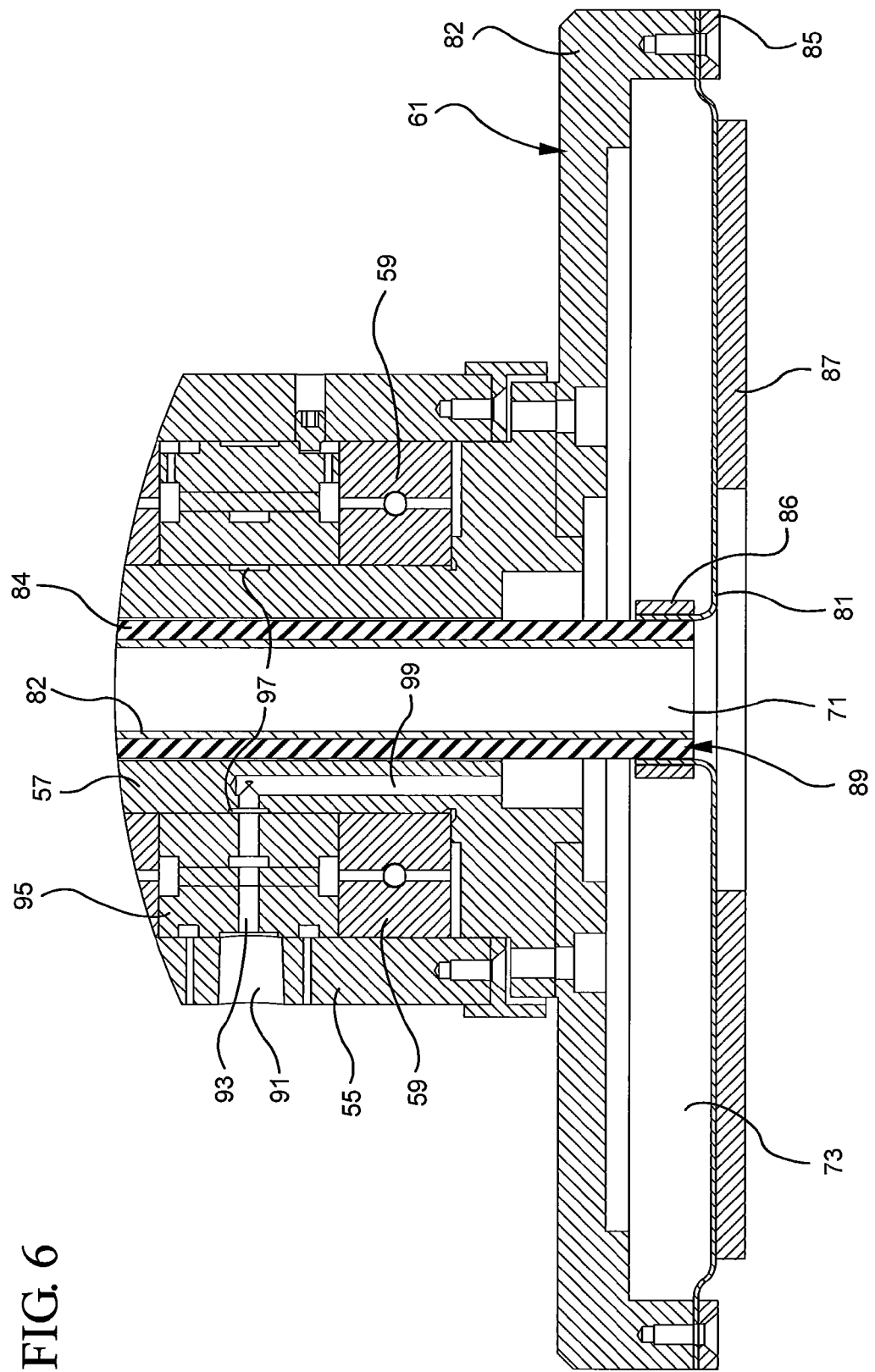
FIG. 6 is cross-sectional side view of a rotary polisher for use with the polishing system of FIG. 5.
Figure 7:
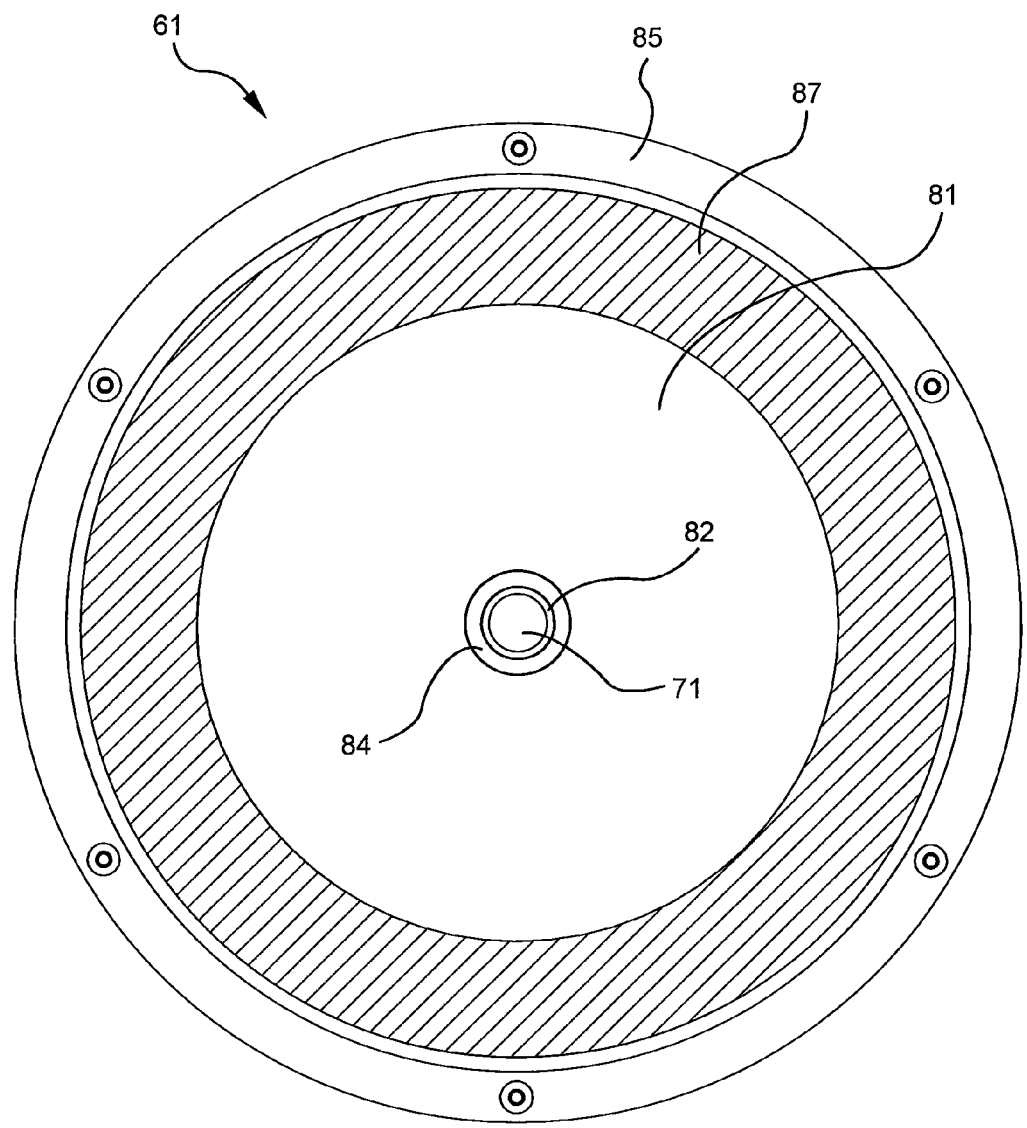
FIG. 7 is a bottom view of the rotary polisher of FIG. 6.
Figure 8:
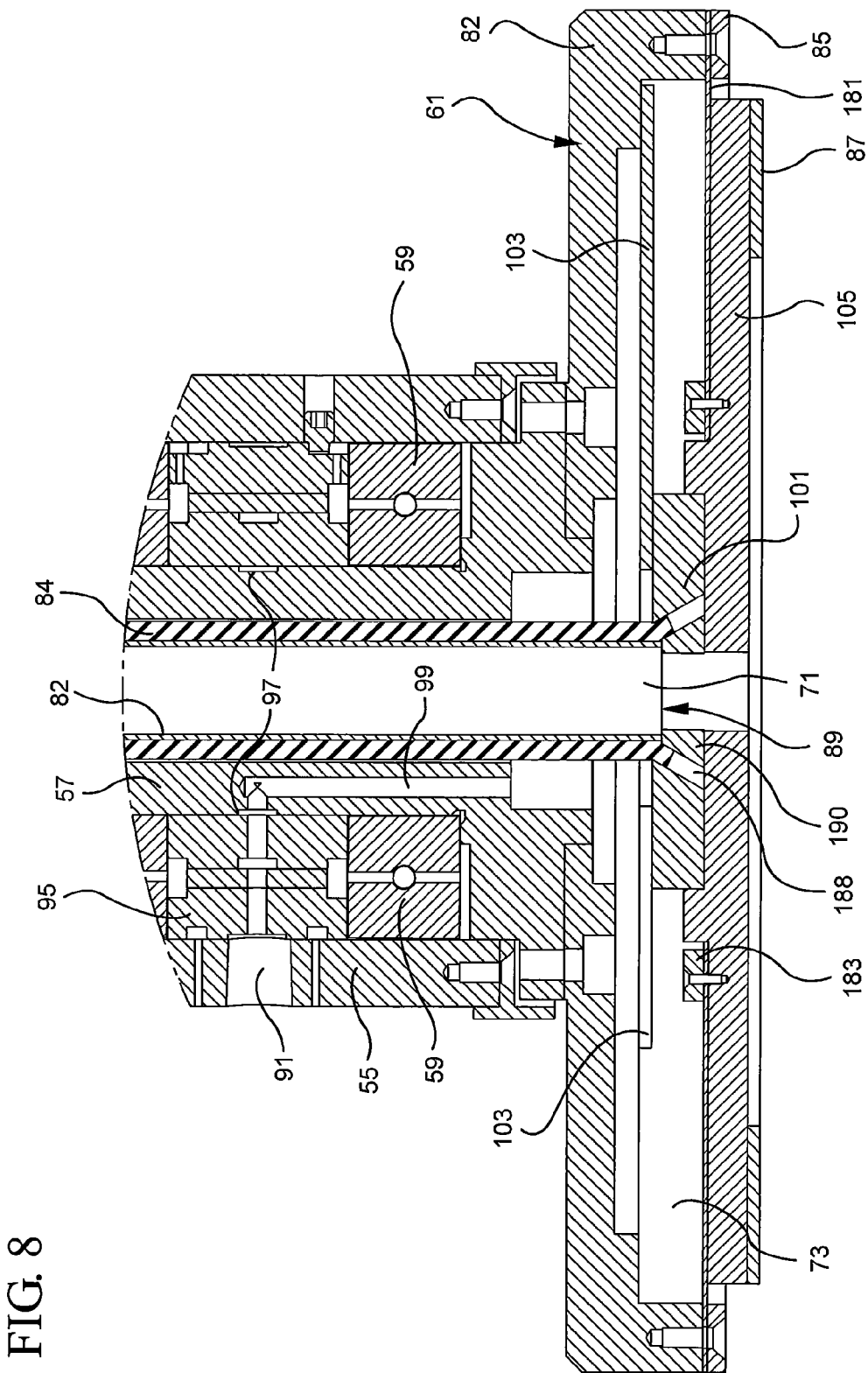
FIG. 8 is an alternative embodiment of a rotary polisher for use with the polishing system of FIG. 5.

Referring now to FIG. 6, the polishing head 61 is a disc or upside down saucer shaped head having a downwardly facing outer face and an open cavity 73 in the outer face. As best seen in FIGS. 6 through 8, An annular elastic membrane 81, for example, a latex membrane, spans the annular gap between the supply conduit 71 and a rim 82 of the polishing head 61. An outer peripheral edge portion of the flexible membrane 81 may be securely clamped between an outer clamp ring 85 and the rim 82 of the polishing head. The outer clamp ring may be attached to the rim of the polishing head with screws or other suitable fastening means. An inner peripheral edge portion of the annular flexible membrane may be sealingly clamped between a hose clamp 86 and the outer peripheral surface of a lower end 89 of the supply conduit 71. The flexible membrane 81 thus seals the cavity 73 in the polishing head. As best seen in FIG. 7, an annular flexible, e.g. conformable, abrasive polishing pad 87 is affixed to the exposed lower surface of the elastic membrane 81.

The supply conduit 71 may be formed of a metal tube 82. An outer the rubber tube 84 may be provided on the metal tube 82, in order to provide a more secure retention of the membrane between hose clamp and the supply conduit 71. The inner metal tube may be formed of stainless steel or aluminum, for example, and the rubber out tube may be formed of silicon or rubber, for example.

A fluid port 91 is located in the polisher housing 55. A fluid channel 93 in a sleeve 95 (which may alternatively be an integral part of the polisher housing 55) communicates the fluid port with a circumferential groove 97 in the outer surface of the spindle 57. A longitudinal fluid channel 99 in the spindle communicates the peripheral groove 97 in the spindle with the cavity 73 in the polishing head 61. Pressurized fluid, such as air or oil, is supplied to the fluid port 91 and delivered to the sealed cavity 73 in the polishing head via the channels 93, 99 and the groove 97 for pressurizing the cavity 73 in a controlled manner as is well understood in the art.

FIG. 6 illustrates the polishing head with the cavity 73 in the polishing head pressurized, such that the elastic membrane 81 is inflated and polishing pad 187 is biased downward against a workpiece surface (not shown). The pressure in the cavity 73 applies a controlled and uniform polishing pressure to the back side of the conformable elastic membrane 81 and polishing pad 87, for inflating the membrane and pressing the polishing pad downward against a workpiece surface (not shown). The elasticity of the membrane 81 and the polishing pad 87 also allow the polishing pad to conform to the surface of the workpiece, such that the polishing pressure is substantially uniform over high and low spots of an uneven workpiece surface, such as a thin exfoliated silicon film on an SOI substrate. The more elastic the polishing pad and the elastic membrane, then the more uniform the pressure is across high and low spots on an uneven workpiece surface and the more even the material removal is across the workpiece surface. For example, the polishing pad may have a modulus of elasticity of 10 to 100 MPA. The elastic membrane may, for example, have a modulus of elasticity of 1 MPa to about 100 MPa, of about of 10 to 100 MPA, or about 3 MPa. The elastic membrane may, for example, have a modulus of elasticity of 1 MPa to about 100 MPa, or about 3 MPa. The supply conduit may be a metal tube.

In a variation (not illustrated) of the embodiment of FIG. 6, the annular elastic membrane 81 may be replaced with a circular elastic membrane without a hole in the center for the supply conduit. In which case, the supply conduit and the hose clamp may be eliminated from the polishing head. In which case, spindle would either be solid or the plugged, such that the pressurized fluid in the cavity 73 cannot escape through the spindle. Polishing slurry may be provided to the work area via a supply conduit or nozzle located adjacent to the polishing head.

Figure 9:
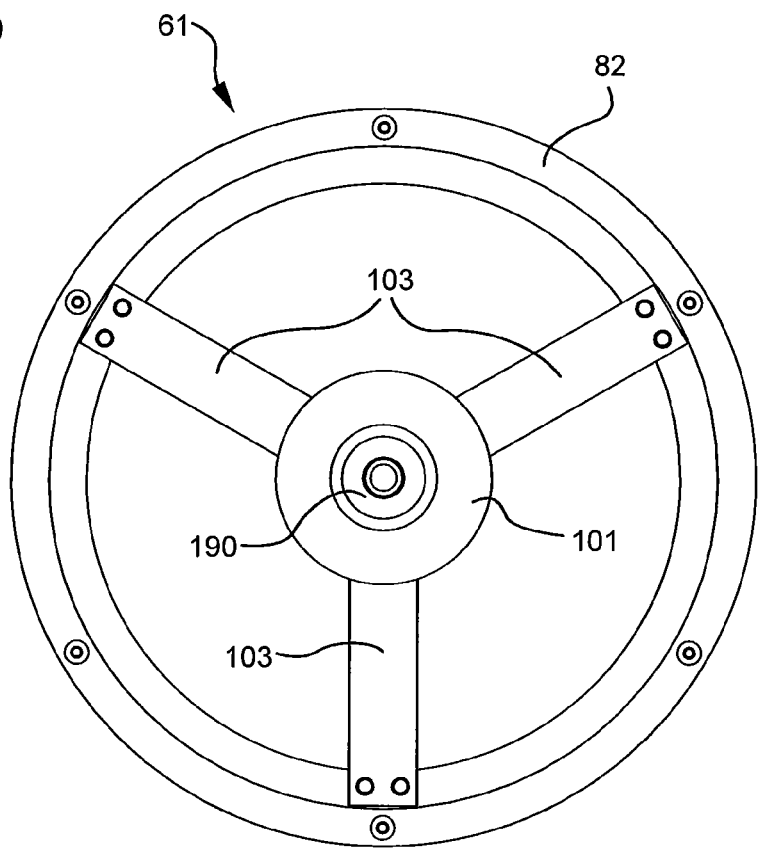
FIG. 9 is a bottom view of the rotary polisher of FIG. 8, with the polishing pad and mounting ring removed.

With reference now to FIG. 8, according to another embodiment of a rotary polisher as described herein, an annular hub 101 is resiliently suspended centrally in the head 61 on flat springs 103 that extend radially from the polishing head to the hub. The flat springs 103 are best seen in FIG. 9, which is a bottom view of the inside of the polishing head of FIG. 8 without the disc, elastic membrane and clamp ring removed (these elements are described below). An annular rigid disc 105 is attached to the hub 101 with screws or other suitable fasteners. An annular elastic membrane 181, for example, a latex membrane, spans the annular gap between the disc 105 and a rim 82 of the polishing head 61. An inner peripheral edge portion of the elastic membrane 181 may be securely clamped between an inner clamp ring 183 and the disc 105. The inner clamp ring 183 may be attached to the cap with screws or other suitable fastening means. An outer peripheral edge portion of the flexible membrane 181 may be securely clamped between an outer clamp ring 85 and the rim 82 of the polishing head. The outer clamp ring may be attached to the rim of the polishing head with screws or other suitable fastening means. The flexible membrane 181 seals the cavity 73 in the polishing head. An annular flexible, e.g. conformable, abrasive polishing pad 87 is affixed to the exposed lower surface of the disc.

According to one embodiment of a rotary polisher as described herein, the hub 101 and rigid disc 105 are mounted on a lower end 89 of the supply conduit 71. Supply conduit 71 may be formed of an inner metal tube 84 and an outer rubber tube 86. The supply conduit 71 communicates with axially extending through holes in the hub 101 (and plug as described hereinafter), disc 105 and polishing pad 87 for delivering polishing slurry to a center of the polishing pad 87. The inner metal tube 84 serves to provide structural rigidity to the outer rubber tube 86.

In order to mount the hub 101 to the lower end 89 of the outer rubber tube 84, the lower end of the outer rubber tube extends into a conically expanding through-hole 188 in the hub 101. A frustoconical plug 190 is inserted into the lower end of the rubber tube 84. The plug is securely clamped between the disc 105 and the hub 101, which are fastened together with screws or bolts, such that the lower end 89 of the rubber tube 84 is securely and sealingly clamped between the outer frustoconical surface of the plug 190 and the inner frustoconical surface of the hub 101. The end 89 of outer rubber tube extends beyond the inner metal tube in order to flexibly mount the hub and disc to the spindle 57.

The resilient suspension of the hub 101 and rigid disc 105 on the flat springs 103 and flexible outer rubber tube 84 enables the hub and disc to tip or pivot on the lower end of the flexible outer rubber tube 84, thereby providing degree of conformability to polishing pad. Alternatively, a universal or other gimbaled or pivoting joint may be employed to connect a rigid supply conduit to the hub 101, and the outer rubber tube may be eliminated.

An annular polishing pad 87, such as a Politex pad, is attached to a lower surface of the rigid disc 105. Pressurized air is supplied to the cavity 73 in polishing head 61 to create polishing pressure behind the elastic membrane and bias the rigid disk and the polishing pad against a workpiece surface. The rigid disc 105 is suspended in the polishing head by the springs 103, such that the disc 105 and the polishing pad 87 may be biased downward against the workpiece surface and tilt with the workpiece surface, providing a degree of conformability to the polishing pad 87 on the workpiece surface. The rigid disc, however, somewhat removes the elastic ability of the polishing pad to conform to the uneven workpiece surface compared to mounting a conformable polishing pad directly on the elastic membrane. The elastic membrane 181 may, for example, have a modulus of elasticity of 1 MPa to about 100 MPa, or about 3 MPa. Alternatively, the elastic membrane 81, 181 may be eliminated, and the hub and rigid disc may be suspended and biased against the workpiece surface solely by the springs 103. The stiffness of the springs may be 0.502 N/nm.

Experiments were conducted with three different polishing head arrangements. All other polishing parameters (i.e. polishing pressure of 3 psi, polishing speed <100 rpm, and cerium oxide slurry) were maintained the same in all the three experiments. The resulting film thickness non-uniformity was calculated using the following relationship: (Maximum thickness−Minimum thickness)/(Maximum thickness+Minimum thickness)×100.

EXPERIMENT 1

As transferred layers 15 of SOI substrates 11 were thinned and polished with a polisher substantially as described herein and illustrated in FIG. 6 having a conformable flexible abrasive polishing pad mounted directly to a circular pressurized elastic membrane, e.g. no slurry hole in the center. The compliance of the polishing pad and the membrane employed resulted in a relatively uniform pressure distribution over the polishing area and hence produced a thin silicon layer or film with a satisfactory level of film thickness uniformity. The resulting film thickness non-uniformity was 7%.

EXPERIMENT 2:

As transferred layers of SOI substrates were thinned and polished with a polisher as used in Experiment 1, but having polyester polishing pad mounted directly to the pressurized elastic membrane in place of the polishing pad 87. The greater compliance of the polyester material compared to the polishing pad employed in Experiment 1 resulted in a more uniform pressure distribution over the polishing area and hence produced a thin silicon layer or film with a greater level of film thickness uniformity than the was achieved with the polishing pad in experiment 1. The resulting film thickness non-uniformity was 2.5%.

EXPERIMENT 3:

As transferred layers of SOI substrates were thinned and polished with a polisher as described herein and illustrated in FIG. 8 having an abrasive polishing pad mounted to a rigid disc on a pressurized elastic membrane. The resulting film thickness non-uniformity was 33%. This arrangement provided the lease uniform material removal and the least uniform layer thickness of the three arrangements.

Experiments 1 through 3 clearly demonstrate that applying polishing pressure to the surface of the workpiece to be polished through a compliant conformable membrane and polishing pad results in more uniform polishing of the wafer and finishes a thin film to a more uniform thickness then when applying pressure through a rigid, non-conformable polishing head as in conventional CMP processes. This is because applying pressure through a compliant membrane results in a more uniform pressure distribution over the polishing area. Thus, the conformable polishing heads as illustrated in FIGS. 5 through 8 and FIG. 10 may be most advantageously used to thin an as transferred, exfoliated layer or film of semiconductor on an SOG or SOI substrate, in order to remove the damaged and contaminated outer layer of silicon or other semiconductor material and produce the final SOI or SOG substrate, and reduce pillowing when polishing rectangular or other non-circular workpieces. However, it will be appreciate that conformable polishing according to FIG. 9 may also be employed to thin an as transferred, exfoliated layer of silicon an SOG or SOI substrate to remove the damaged and contaminated outer layer of silicon, and to reduce the incidence of pillowing when polishing rectangular workpieces, such as when refreshing rectangular semiconductor donor tiles for re-use in an ion implantation thin film transfer process and when polishing rectangular SOG substrates.

In accordance with one embodiment of a conformable CMP process as described herein. A flat rigid workpiece 21 with an uneven surface to be polished, such as an SOI substrate 11, or a non-round workpiece is mounted on the vacuum chuck on the oscillating base or table 23 and the vacuum chuck is activated to secure the workpiece in place on the table. The polishing head 27, 61 is placed in a polishing position with the annular polishing pad 87 in contact with the surface of the workpiece. Polishing slurry, such as cerium oxide, is supplied to the interface between the polishing pad via the supply conduit 71 and the SOI substrate. The motor 51 is activated to rotate the polishing 61 head at a speed of up to 100 revolutions per minute, and the table 23 is activated to oscillate at a speed of about 50 mm/second. The polishing head may alternatively be oscillated, while the table and the workpiece remain stationary. The polishing head and table are oscillated and rotated relative to each other, in order to achieve uniform polishing across the workpiece surface. The table may also be rotated in a direction opposite to that of the polishing head. Pressurized air is supplied to the cavity 73 in the polishing bead at a controlled pressure of about 3 pounds per square inch. Polishing is continued until the desired workpiece thickness or surface finish is achieved, in the case of an SOI substrate, until the desire semiconductor or silicon film thickness or surface finish is achieved.

The particle size and concentration of abrasive particles in the polishing slurry, size and distribution of abrasive particles or protrusions on the polishing pad design of a polishing pad (e.g. smooth, grooved, etc.), polishing pressure, e.g. the controlled pressure in the polishing head, and rotational speed of the polishing head and table, can be selected to achieve relatively high removal rates, while generating good surface uniformity and finish.

Figure 10:
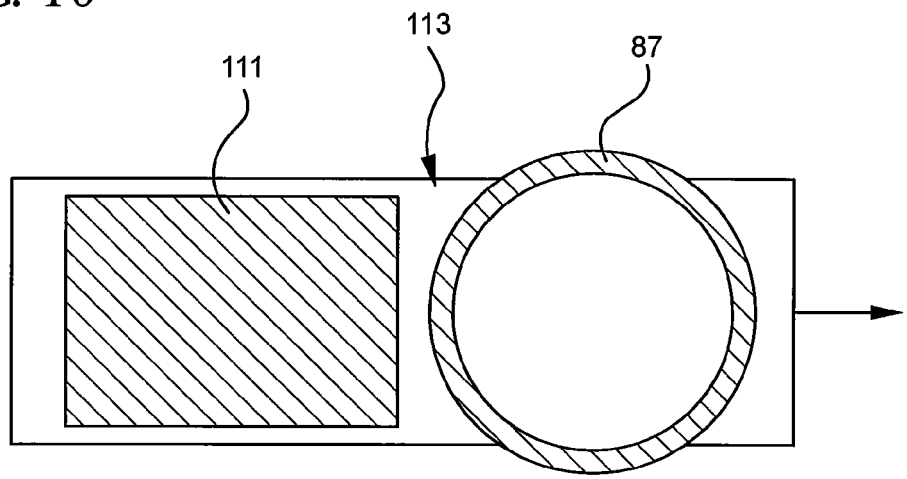
FIG. 10 is a diagrammatic top plan view of a continuous conformable polishing system according to an embodiment of the present invention.

FIG. 10 diagrammatically illustrates a system and process for continuously polishing a plurality of workpieces on a moving conveyor with a conformable polisher as described herein one workpiece at a time, one after the other, in an automated fashion. The workpieces 111 in FIG. 10 (only one workpiece 11 is shown) are illustrated as rectangular workpieces, such as rectangular semiconductor wafers or SOI substrates, however, the workpieces could be round or any other shape. The workpieces 111 are held on a moving conveyor belt or table 113 by suction in known manner. Suction may be applied to the workpieces through a porous conveyor, or the workpieces may be held by a plurality of vacuum chucks spaced along the conveyor (not shown). The workpieces are carried by the conveyor under the polishing head, and are polished by the polishing pad 87 as they pass one by one under the polishing head. As illustrated in 10, The outer diameter of the annular polishing pad 87 is greater than the width of the workpiece, such that the annular polishing pad spans the entire width of the workpiece. The inner diameter of the polishing pad 87 is also greater than the width of the workpiece, such that material is more uniformly removed from the entire diameter or width of the workpiece surface as the workpiece is oscillated relative to the polishing pad as illustrated in FIG. 4 or translated past the annular polishing pad as illustrated in FIG. 10. The size and annular shape of the polishing pad provides for a relatively uniform polishing time and speed from one side to the other side of a workpiece surface, and therefore a relatively uniform removal of material from one side to the other side of a workpiece, as the workpiece travels past the polishing head on the conveyor.

The polishing slurry may be any suitable commercially available CMP polishing slurry, such as a cerium oxide or other colloidal silica slurry. Use of a cerium oxide will reduce the cost of consumables compared to using expensive slurries which are used in conventional CMP.

The elastic membrane may be formed of any suitable elastic material, such as latex or silicone rubber, for example. The elastic membrane preferably has a modulus of elasticity of about 1 to about 100 MPa.

The polishing pad may be a porous polishing pad, such as porous-non-fibrous pads produced by coagulating polyurethane, and in particular, coagulating a polyetherurethane polymer with polyvinyl chloride commercially, and are available as POLITEX™ high, regular and low nap height polishing pads sold by Rodel, Inc. The abrasive pad may include a fixed abrasive structure, which is a micro-replicated pattern of micron-sized posts on the contact surface thereof. The posts contain an abrasive material in a resin-like matrix. The fixed abrasive materials may be obtained from the 3M Company, St. Paul, Minn. Such an embodiment is believed to be advantageous when polishing silicon on glass (SOG) substrates. The surface of the polishing pad that engages the workpiece surface is preferably deeply grooved or channeled. By way of example, the grooves may be in a perpendicular, crosshatched arrangement on the order of about 21 mm×21 mm in a Cartesian coordinate plane and may be about 1 mm or more deep. A suitable polishing pad may be obtained from Rohm-Haas Incorporated, presently sold as SUBA 840 PAD 48"D PJ;XA25 (supplier material number 10346084). Alternative patterns for the groove 222 are possible, such as diamond-shaped grooves, spiral-shaped grooves, radially and/or circumferentially extending grooves, etc.

The workpiece may be any material, such as glass, glass ceramic, semiconductor, and combinations of the above, such as semiconductor on insulator (SOI) or semiconductor on glass (SOG) structures. In the case of semiconductor materials, such may be taken from the group comprising: silicon (Si), germanium-doped silicon (SiGe), silicon carbide (SiC), germanium (Ge), gallium arsenide (GaAs), GaP, and InP.

Various advantages of the proposed process are:

The disclosed apparatus and method of pressure application allows a more uniform polishing pressure distribution over the workpiece surface as compared with the conventional CMP process.

The disclosed apparatus and method separates the chuck or other device that holds the workpiece during polishing form the polishing mechanism that applies pressure to and polishes the surface of the workpiece, providing for a simpler polishing mechanism compared with conventional CMP.

The proposed disclosed apparatus and method of polishing by holding the wafer on a rigid table and applying polishing pressure at the top by means of a polisher head makes it possible to perform wafer polishing on a continuous conveyor. Polishing on a conveyor increases productivity and eliminates part handling and transfer time during different process stages which results in reduced costs. Conventional CMP polishing, in which a rigid workpiece is held on the rotary head and rotated against a polishing pad on a turntable, cannot be performed in a conveyor style polishing setup.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A conformable polishing apparatus, comprising:
    a conveyor upon which a plurality of workpieces may be releasably coupled for moving the workpieces laterally past a rotary polisher one workpiece at a time in a continuous process,
    wherein the rotary polisher has a resiliently conformable annular polishing pad mounted thereon for contacting and resiliently conforming to a surface of a workpiece coupled to the conveyor and a polishing slurry supply conduit having an outlet located at a center of the annular polishing pad for supplying polishing slurry to a surface of a workpiece, the annular polishing pad having an outer diameter and an inner diameter that is larger than a width or diameter of a workpiece coupled to the conveyor such that the annular polishing substantially uniformly removes material from the entire surface of the workpieces as the workpieces move past the polisher.

2. A conformable polishing apparatus according to claim 1, wherein the polisher further comprises:
    a polishing head, a cavity in the polishing head behind the annular polishing pad, and a pressurized fluid supply channel communicating with the cavity for providing fluid at a controlled pressure to the cavity and pressing the annular polishing pad against a surface of a workpiece coupled to the base with a uniform pressure.

3. A conformable polishing apparatus according to claim 1, wherein the rotary polisher includes a polishing head that defines a downwardly opening cavity;
    an elastic membrane spans the downwardly opening cavity and sealingly encloses the downwardly opening cavity to form a pressure cavity;
    the annular polishing pad is mounted on an outer surface of the elastic membrane; and
    a fluid supply channel in the polishing head communicates with the pressure cavity for providing fluid at a controlled pressure to the pressure cavity for inflating the elastic membrane and pressing the annular polishing pad against a surface of a workpiece coupled to the base with a uniform pressure.

4. A conformable polishing apparatus according to claim 3, wherein:
    the rotary polisher includes a spindle;
    the polishing head is mounted on an end of the spindle;
    the supply conduit extends axially through a center of the spindle; and
    there is a hole in a center of the elastic membrane defining an inner peripheral edge on the elastic membrane, wherein the inner peripheral edge of the elastic membrane is sealingly attached to an end of the supply conduit, such that polishing slurry is supplied through the supply conduit to a center of the annular polishing pad.

5. A conformable polishing apparatus according to claim 4, wherein:
    the supply conduit is a flexible tube;
    a rigid disc is sealingly attached to a lower and of the tube and lies against the outer surface of the elastic membrane, such that the flexible tube may bend and allow the disk to tilt; and
    the annular polishing pad is attached to an outer surface of the rigid disk.

6. A conformable polishing apparatus according to claim 5 wherein the rigid disc is suspended in the polishing head on a plurality of leaf springs in the cavity that extend radially inward from the polishing head to the rigid disc.

7. A conformable polishing apparatus according to claim 1, wherein the workpiece is a flat rectangular workpiece.

8. A conformable polishing apparatus comprising:
    a rotary polishing head;
    a conveyor upon which a plurality of workpieces may be releasably coupled for moving the workpieces laterally past the polishing head one workpiece at a time in a continuous process;

a flexible annular polishing pad on the polishing head for conforming to and applying a uniform polishing pressure to a surface of a workpiece, the annular polishing pad having an inner diameter that is larger than a width or diameter of a workpiece coupled to the conveyor such that the annular polishing substantially uniformly removes material from the entire surface of the workpieces as the workpieces move past the polishing head;

a supply conduit extending axially through a center of the polishing head and a center of the polishing pad for supplying polishing slurry to a center of the polishing pad.

9. A conformable polishing apparatus according to claim 8 further comprising;
an open cavity in an outer face of the polishing head;
an elastic membrane sealingly enclosing the open cavity in the polishing head;
the annular polishing pad is located on an outer surface of the elastic membrane;
the supply conduit extends axially through a center of the membrane and the center of the polishing pad; and
a supply channel in the polishing head communicates with the cavity for providing pressurized fluid at a controlled pressure to the pressure cavity for inflating the elastic membrane and conformably pressing the annular polishing pad against a surface of a workpiece with a uniform polishing pressure.

10. A conformable polishing apparatus according to claim 8 further comprising:
an inflatable elastic membrane on an outer face of the polishing head, with the flexible annular polishing pad attached to an outer surface of the inflatable elastic membrane; and
a means for inflating the elastic membrane to a controlled pressure and pressing the polishing pad against a surface of a workpiece with a uniform polishing pressure.

* * * * *